United States Patent [19]
Eckert

[11] 4,445,198
[45] Apr. 24, 1984

[54] MEMORY PROTECTION CIRCUIT FOR AN ELECTRONIC POSTAGE METER

[75] Inventor: Alton B. Eckert, Norwalk, Conn.

[73] Assignee: Pitney Bowes Inc., Stamford, Conn.

[21] Appl. No.: 306,979

[22] Filed: Sep. 29, 1981

[51] Int. Cl.³ .............................................. G06F 1/00
[52] U.S. Cl. .................................................. 364/900
[58] Field of Search ............... 364/200, 464, 466, 900; 365/228, 229

[56] References Cited

U.S. PATENT DOCUMENTS

| | | | |
|---|---|---|---|
| 2,934,009 | 4/1960 | Bach et al. | 101/235 |
| 3,810,116 | 5/1974 | Prohofsky | 364/200 |
| 3,938,095 | 2/1976 | Check, Jr. et al. | 364/200 |
| 3,978,457 | 8/1976 | Check, Jr. et al. | 364/200 |
| 4,285,050 | 8/1981 | Muller | 364/900 |
| 4,287,825 | 9/1981 | Eckert, Jr. et al. | 101/91 |
| 4,301,507 | 11/1981 | Soderberg et al. | 364/464 |

FOREIGN PATENT DOCUMENTS

19515  11/1980  European Pat. Off. ............. 364/900

*Primary Examiner*—Raulfe B. Zache
*Attorney, Agent, or Firm*—David E. Pitchenik; Albert W. Scribner; William D. Soltow, Jr.

[57] ABSTRACT

An electronic postage meter includes a memory protection circuit. The memory protection circuit prevents the inadvertent writing of spurious data into memory locations in the nonvolatile memory during a power down cycle. The memory protection circuit works in conjection with a WRITE voltage terminal associated with the nonvolatile memory. Means couple a first voltage source providing a predetermined polarity voltage to the WRITE voltage terminal when a predetermined power condition exists such that the nonvolatile memory is enabled to have data written into memory locations. When the predetermined power condition does not exist, the means utilize a second different voltage source to change the voltage level at the WRITE voltage terminal to insure that data is not written into the memory locations.

27 Claims, 4 Drawing Figures

MEMORY PROTECTION CIRCUIT FOR AN ELECTRONIC POSTAGE METER

FIELD OF THE INVENTION

The present invention relates to memory protection circuit and more particularly to a nonvolatile memory protection circuit power supply systems for an electronic postage meter.

BACKGROUND OF THE INVENTION

Electronic postage meter systems have been developed as for example the systems disclosed in U.S. Pat. No. 3,978,457 for Microcomputerized Electronic Postage Meter Systems, in U.S. Pat. No. 3,938,095 for Computer Responsive Postage Meter and in European Patent Application, Application No. 80400603.9, filed May 5, 1980 for Electronic Postage Meter Having Improved Security and Fault Tolerance Features. Electronic postage meters have also been developed employing plural computing systems. Such a system is shown in U.S. patent application Ser. No. 089,413, filed Oct. 30, 1979, now U.S. Pat. No. 4,301,507, for Electronic Postage Meter Having Plural Computing Systems and assigned to Pitney Bowes Inc.

The accounting circuits of electronic postage meters include nonvolatile memory capability to store postage accounting information. This information includes, for example, the amount of postage remaining in the meter for subsequent printing or the total amount of postage printed by the meter. Other types of accounting or operating data may also be stored in the nonvolatile memory. The memory function in the electronic accounting circuits have replaced the function served in previous mechanical type postage meter by mechanical accounting registers. Postage meters with mechanical accounting registers are not subject to the many problems encountered by electronic postage meters. Conditions cannot normally occur in mechanical type postage meters that prevent the accounting for a printing cycle or which result in the loss of data stored in the registers. Moreover, in mechanical postage meters it is not necessary to electronically monitor the position of the mechanical components associated with printing postage. This, however, is not the case with electronic postage meters.

Conditions can occur in electronic postage meters where information stored in electronic accounting circuits can be permanently lost. Conditions such as a total line power failure or fluctuation in voltage conditions can cause the microprocessor associated with the meter to operate erratically and either cause a loss of data or the storage of spurious data in the nonvolatile memory. The loss of data or the storage of spurious data may result in a loss of information representing the postage funds stored in the meter. Since data of this type changes with the printing of postage and is not stored elsewhere outside of the meter, there is no way to recover or reconstruct the lost information. In such a situation, a user may suffer a loss of postage funds.

To minimize the likelihood of a loss of information stored in the electronic accounting circuit, efforts have been expended to insure the high reliability of electronic postage meters. Some systems for protecting the critical information stored in the meter are disclosed in the above-noted patents and applications. An additional arrangement to protect the postage meter accounting information is shown in U.S. Pat. No. 4,285,050 for Electronic Postage Meter Operating Voltage Variation Sensing System, the disclosure of which is hereby incorporated by reference.

SUMMARY OF THE INVENTION

It has been recognized that it is desirable to keep the power supply for electronic postage meters physically associated with and part of the meter. In the event of an external power failure, the power supply within the secure housing of the postage meter continues to generate a sufficient, regulated power, for a long enough time to orderly and accurately transfer critical information from volatile memory to nonvolatile memory. The problem of insuring proper power during a power down cycle is compounded because certain nonvolatile memories need several different voltages for proper operation. As an example, one type of solid state nonvolatile memory requires the presence of three different voltages for a WRITE operation.

It has been discovered that while microprocessors used in electronic postage meters may be designed to turn off and become inoperative below a predetermined voltage level, such microprocessors may become active again at even lower voltage levels. The microprocessors may turn off below a predetermined voltage level and thereafter within a lower range turn on again and be capable of outputting data. The microprocessors will again turn off below the lower predetermined range. Because of this unreliable operation for turn off, the accounting information within the postage meter can be destroyed by the inadvertent writing of spurious data during a power down cycle when the microprocessor is believed to be inoperative. Moreover, the cost of carefully testing and selecting microprocessor components for postage meters to avoid this problem can greatly increase the cost of such parts, both because of the cost of testing and because of the rejection of the microprocessor devices that exhibit this characteristic.

The present invention provides an improved memory protection circuit. Improved protection is provided against unpredictable circuit operation when power failure occurs for any reason. The protection circuit insures that information is not inadvertently written into a nonvolatile memory, which memory is particularly suitable for use as part of an electronic postage meter system. This form of protection is particularly important in electronic postage meter systems with regards insuring the integrity of accounting data stored in the meter. The present invention insures that erroneous information is not written into nonvolatile memory during a power down cycle.

In accordance with the present invention, a nonvolatile memory includes a WRITE voltage ($V_{GG}$) terminal which when energized by a first predetermined polarity voltage enables the nonvolatile memory to have data written into memory locations. A computing means is operatively coupled to the nonvolatile memory for writing data into such memory location. First means are provided for generating a voltage of the first predetermined polarity, and second means are also provided for generating a second voltage differing from the voltage of the first predetermined polarity. Means are coupled to the first voltage generating means, the second voltage generating means and the WRITE voltage terminal of the nonvolatile memory for applying the voltage of the first polarity to the WRITE voltage terminal when a predetermined power condition exists and for utilizing the second voltage for causing a different voltage level from the first predetermined voltage to be applied to the WRITE voltage terminal when the predetermined power condition is not present. In accordance with a feature of the invention, the control of the voltage levels applied to the WRITE voltage terminal may be independent of the operation of the computing means. Thus, protection is provided against improper data being written into the nonvolatile memory even if the computing means malfunctions during a power down operation.

DETAILED DESCRIPTION OF THE DRAWINGS

A complete understanding of the present invention may be obtained from the following detailed description thereof, when taken in conjunction with the accompanying drawings, in which.

DETAILED DESCRIPTION

Figure 1:
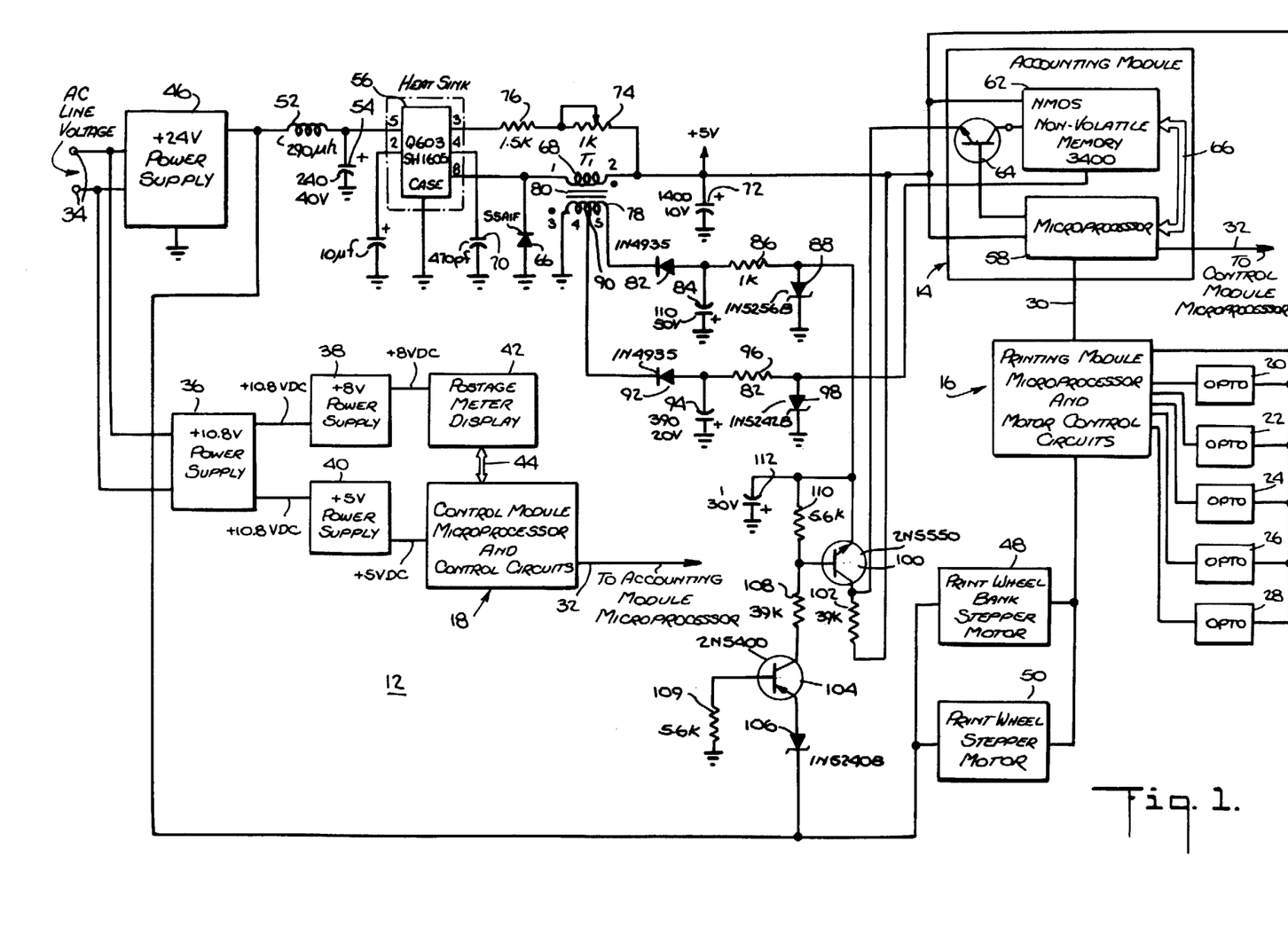
FIG. 1 is a schematic circuit diagram, partly in block form, of an electronic postage meter power supply system embodying the present invention.

Reference is now made to FIG. 1. A postage meter 12 includes: an accounting module 14 having a microprocessor and nonvolatile memory such as a General Instrument Corporation ER3400 type electronically alterable read only memory (this device is described in a General Instrument Corporation manual dated November 1977, entitled EAROM and designated by number 12-11775-1); a printing module 16 having microprocessor and motor control circuits; and a control module 18 having microprocessor and control circuits. The details of construction and operation of the system may be in accordance with the postage meter systems and the mechanical apparatus shown in the above-noted patent application for Electronic Postage Meter Having Plural Computing Systems and in U.S. Pat. No. 4,287,825 for Printing Control System. Postage meter 12 includes a series of opto-interrupters 20, 22, 24, 26, and 28. The opto-interrupters are used to sense the mechanical position of the parts of the meter. For example, the opto-interrupters can be employed to sense the position of the shutter bar which is used to inhibit operation of the meter under certain circumstances, the position of the digit wheels, the home position of the print drum, the position of the bank selector for the print wheels, the position of interposer, or any other movable mechanical component within the meter. These opto-interrupters are coupled to the printing module 16 which monitors and controls the position of the mechanical components of the meter.

The printing module 16 is connected to the accounting module 14 via a serial data bus 30 and communicates by means of an echoplex technique described in the above-noted U.S. Patent Application for Electronic Postage Meter Having Plural Computing Systems. Both ends of the bus are buffered by an optics buffer, not shown, which is energized by the power supply ±5 volt line to be hereafter described. Similarly, the control module 18 is connected to the accounting module 14 via a serial data bus 32 and also communicates by means of the echoplex technique. Optics buffers, not shown, are provided to buffer the bus. It should be regonized that the particular architecture of the postage meter system is not critical to the present invention. Plural or single microprocessor arrangement may each be employed with the present invention.

A source of operating voltage, such as 110 volt 60 cycle supply, is applied across the meter input terminals 34. The voltage is applied to a linear 10.8 volt power supply 36. The output from the 10.8 volt linear power supply 36 is supplied to a first 8 volt linear regulated power supply 38 and to a second 5 volt linear regulated power supply 40. The 8 volt supply is used to power a display 42 which is operatively coupled via a bus 44 to the control module 18. The output from the power supply 40 is directly coupled to the control module 18 and is operated to energize the control module microprocessor.

The AC operating voltage at terminals 34 are also applied to a silicon controlled rectifier type, 24 volt power supply 46. The regulated output from the power supply 46 is applied to the printwheel bank stepper motor 48 and the printwheel stepper motor 50 associated with the printing module 16. The 24 volt DC is coupled by an AC choke 52 to capacitor 54. The internal capacitance within the 24 volt power supply 46 provides sufficient energy storage to continue to properly energize a switching regulator 56 should an AC power failure occur at terminals 34. In such event, the accounting module microprocessor 58 transfers information from the postage meter volatile memory (which may be internal or external to the microprocessor) via the data bus 66 to a nonvolatile memory 62. The switching regulator 56, in conjunction with a transformer with related circuitry, provide regulated output voltages used to energize the accounting module.

A plus five volts is developed and is applied to the accounting module microprocessor 58, to NMOS nonvolatile memory 62, to the optic buffers (not shown) for the serial data bus 30 connected between the accounting and printing modules, to the printing module 16, and to the opto-interrupters 20–28. A minus 30 volts is also developed and is applied via a NPN transistor 64 to the nonvolatile memory 62. The operation of transistor 64 is controlled by the accounting module microprocessor 58. The minus 30 volts is required in conjunction with a minus 12 volts which is also developed and applied to the nonvolatile memory 60 and the plus five volts to enable the nonvolatile memory to have data written into the device.

The switching regulator 56 functions to selectively apply the 24 volts developed across the capacitor 54 to the junction of a diode 66 and poled transformer primary winding 68. The frequency at which the regulator 56 operates or switches is determined by a capacitor 70 which controls the operating frequency of the supply. Primary winding 68 is further coupled to ground by a capacitor 72. Diode 66 and capacitor 72 form a complete circuit in parallel with the primary winding 68. The circuit path is through a point of fixed reference potential, here shown as ground.

During quiescent operation, a +5 volts is developed across capacitor 72. This voltage is sensed and coupled via a series connected variable resistor 74 and a fixed resistor 76 to an input terminal on the switching regulator 56. The feed back path controls the supply to maintain a constant voltage across capacitor 72. For the component values shown, a voltage variation of approximately 10 millivolts can occur across the capacitor 72. A step up secondary winding 78 oppositely poled to the primary winding and is electromagnetically coupled via a mollypermoly core 80 to the primary winding 68. The secondary winding 78 is connected to ground at one end and has its opposite end coupled via a diode 82 which operates in conjunction with a capacitor 84 and current limiting resistor 86 to develop a −30 volts across a zener diode 88. A center-tap 90 on the secondary winding 78 is connected to a diode 92 which operates in conjunction with a capacitor 94 and a current limiting resistor 96 to develop a −12 volts across a zener diode 98.

Because of the filtering provided by capacitor 72 and the inductance of the primary winding 68, the noise introduced by the switching transients in the primary circuit is minimized. In a like manner, the capacitors 84 and 94 and the inductance of the secondary winding 78, provide further filtering which also minimizes the noise introduced by the switching transients. The operation of the power supply system is described in greater detail in the U.S. patent application, Ser No. 06/306,805, of Roland G. Miller for Power Supply System filed concurrently herewith.

A circuit is provided to insure that the nonvolatile memory 62 is not energized by the −30 volts necessary for a writing operation after a particular voltage condition in the power down sequence has been reached. This insures that even if data is put onto the nonvolatile memory bus 66 by the microprocessor 62, the data will not be written into the nonvolatile memory. This is particularly important because it has been discovered that although the microprocessor may be designed to turn off and not output data at a determined voltage level for example, when the +5 volt supply drops below voltage +4.50 volts, it has been discovered that such microprocessors may become active again at even lower voltages such as +3 volts. Specifically, it has been discovered with one particular type microprocessor designed to turn off at +4.5 volts that a range of around +3 to +2.2 volts exists where the device may become active again although within the supposedly inactive range for the device. For another type microprocessor designed to turn off when the +5 operating voltage supply drops below +4.75 volts, it has been discovered that a range around +3.0 volts exists where the device may become active again, similarly again within the range supposedly inactive for the device.

The −30 volt supply to the nonvolatile memory 62 is passed through the collector-emitter electrode current path of the NPN transistor 100. The collector electrode of the transistor is coupled via a resistor 102 to the +5 volts developed at capacitor 72. Base bias for the transistor 100 is obtained from a NPN transistor 104. The emitter electrode of the transistor 104 is connected by a 10 volt zener diode 106 to the +24 volt DC supply 46. A resistor 109 provides a ground return for transistor 104. Resistors 108 and 110 are connected to the base electrode of transistor 100. A capacitor 112 is provided to further filter transients.

In operation when the voltage at the AC lines fails, a power down routine is initiated. The routine may be initiated by a system such as that disclosed in the aforementioned U.S. Pat. No. 4,285,050 for Electronic Postage Meter Operating Voltage Variation Sensing System. When the AC line voltage drops to a level such that the 10 volt zener diode 106 no longer is operating in a break down mode, transistor 104 is biased out of conduction. As a result, transistor 100 is also biased out of conduction. This causes the +5 volts which applied via resistor 102 to the collector electrode of transistor 100 to be applied to the emitter electrode of transistor 64. The +5 volts reverse biases transistor 64 and insures that no information can be written into the nonvolatile memory 62 during the remainder of the power down cycle as a −30 volt is required to enable a WRITE operation in the nonvolatile memory.

For the various supplied and component values shown, by the time the output voltage of the +24 volt supply 46 decays to +7.5 volts, the +5 volts developed at capacitor 72 will begin to drop. By this time, however, the 10 volt zener diode 106 has already been turned off for a voltage change of approximately 2½ volts and the transistor 64 is, of course, already in a reverse bias condition. Thus, when the output voltage from +24 volt supply drops to approximately +10 volts, transistor 64 is reverse biased and no data can be written by microprocessor 58 into nonvolatile memory 62. As the power continues to dissipate the transistor 64 remains reverse biased. Transistor 64 continues to be reversed biased through the decay cycle, until the voltage falls below the junction potential of the device, normally +0.7 volts. By this time, however, the microprocessor has passed through the range of uncertain operating voltages and is completely inoperative. By this means, a further enhanced security is provided in the operation of the nonvolatile memory 62 and additionally, a wider spectrum of microprocessor devices with concomident cost advantages can be employed in the postage meter.

Figure 2:
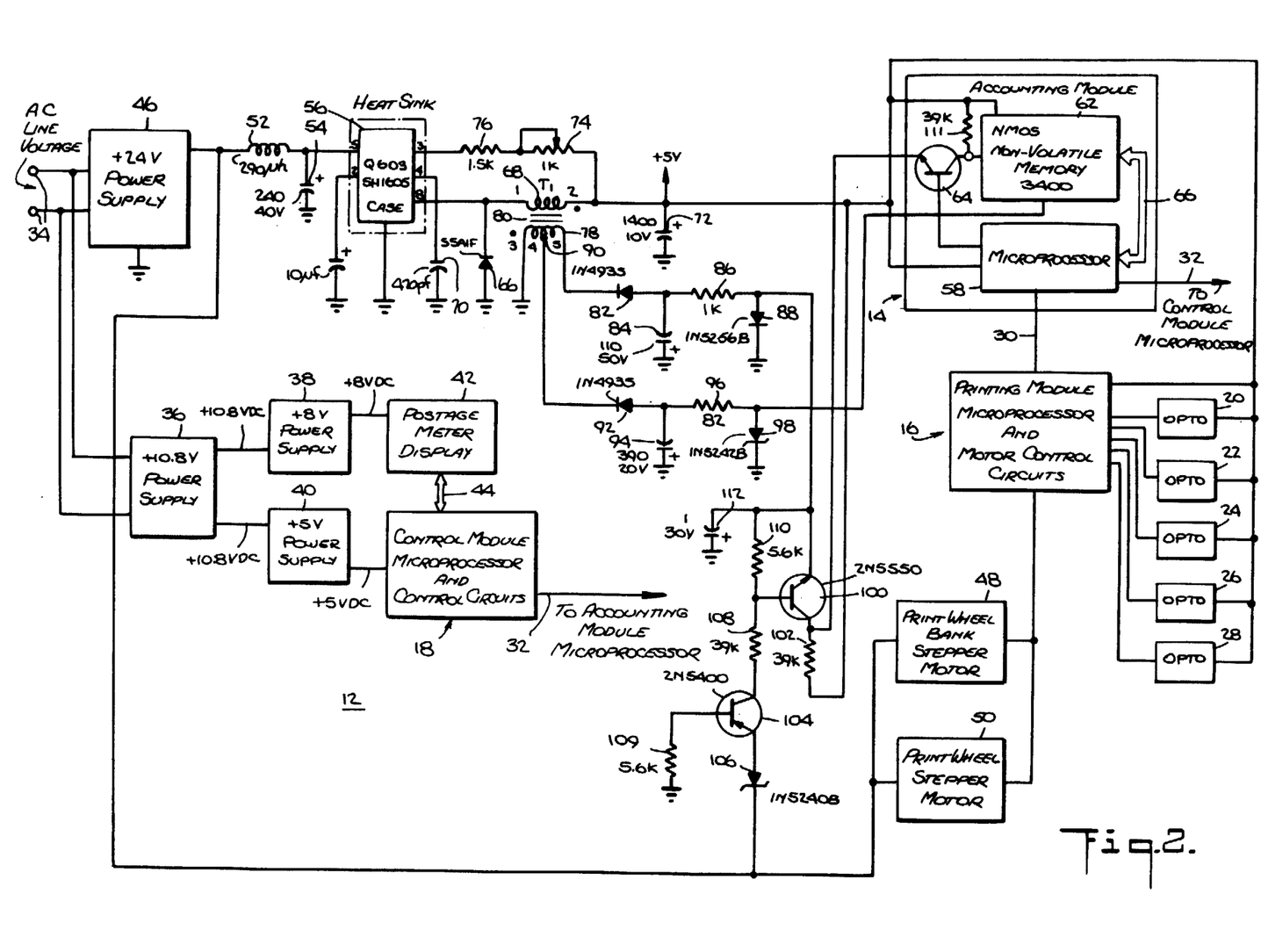
FIGS. 2 and 3 are alternate embodiments of the invention shown in FIG. 1 involving modification of the memory protection circuit.

Reference is now made to FIG. 2. In this embodiment of the present invention a resistor is added to the schematic circuit diagram shown in FIG. 1 to apply the +5 volt supply directly to the WRITE voltage terminal. Thus, a resistor 111 is provided and is connected between the collector electrode of transistor 64 and capacitor 72. This provides yet further enhanced memory protection over the circuit shown in FIG. 1.

Figure 3:
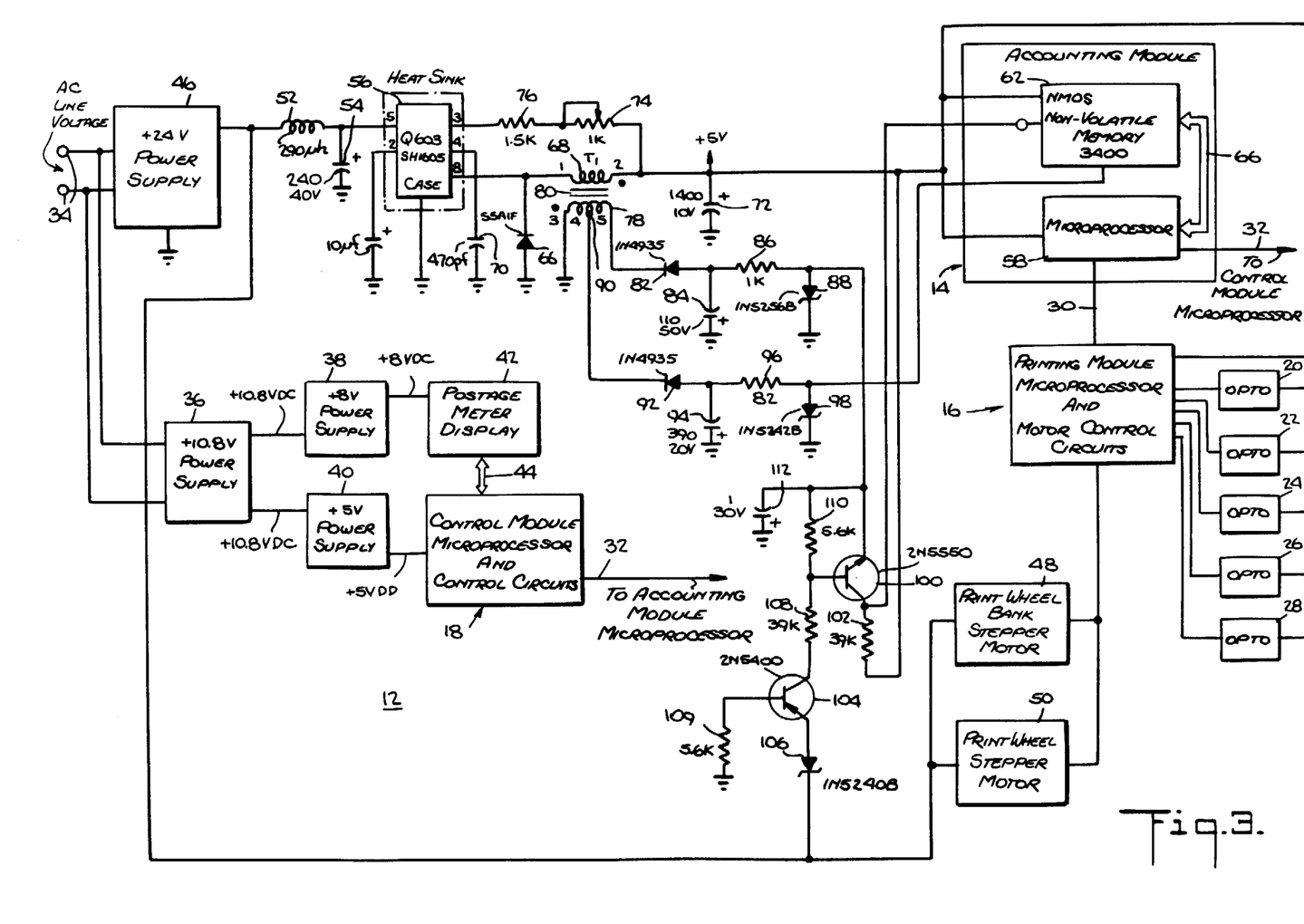

In the embodiment of the invention shown in FIG. 3, transistor 64, shown in FIGS. 1 and 2 is eliminated and the collector electrode of transistor 100 is directly connected to the WRITE voltage terminal. The structure eliminates the redundant protection afforded by both transistor 64 whose base bias is controlled by microprocessor 58 and transistor 100 whose base bias is dependent upon voltage levels in the postage meter's power supply systems. Protection is afforded in this case by control over the conductivity of the collector-emitter electrode current path of transistor 100.

Figure 4:
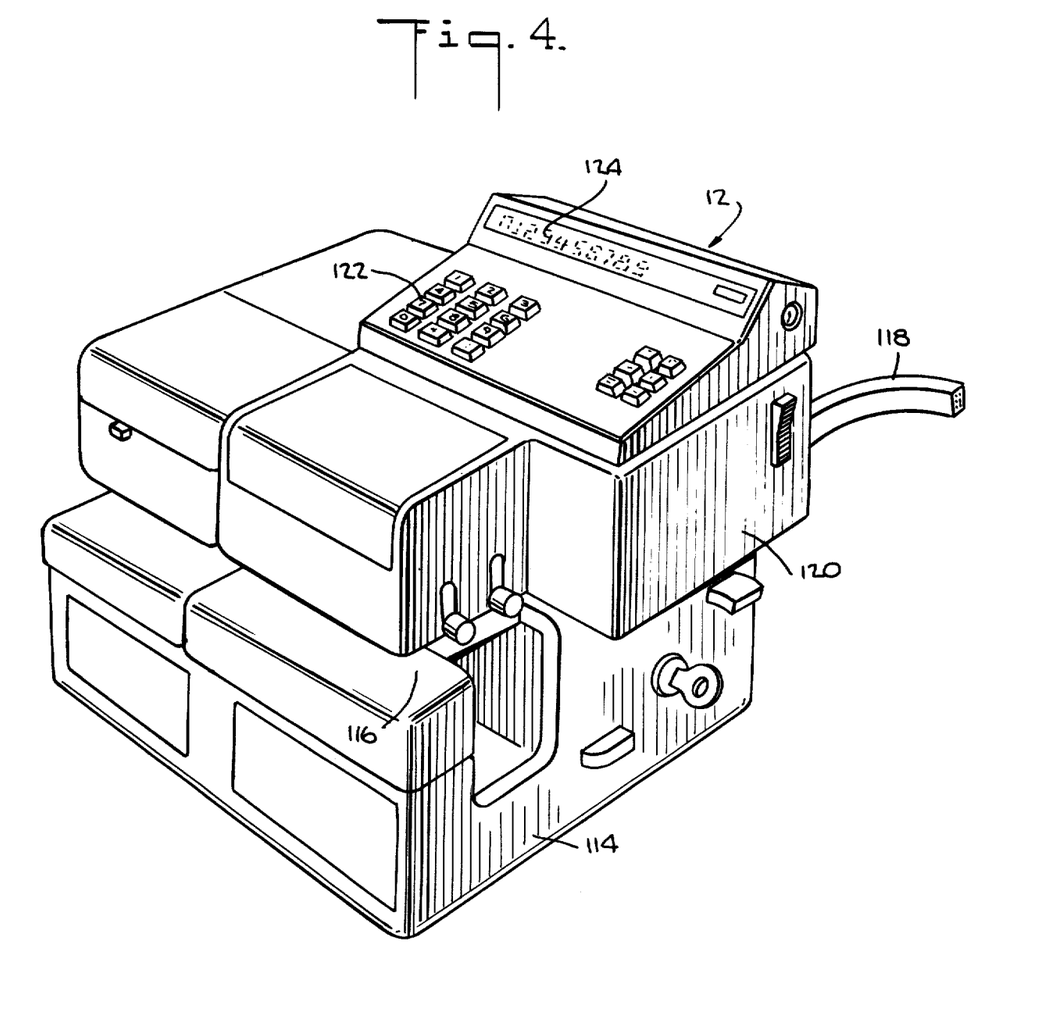
FIG. 4 is a perspective view of an electronic postage meter showing the outer housing, the meter keyboard and meter display.

Reference is now made to FIG. 4 which is a perspective view of an electronic postage meter suited to incorporate the present invention. The postage meter 12 is detachably secured to a base unit 114 so as to form a letter slot 116 therebetween at the front edge of the assembly. The base unit 114 may be mechanically of the type disclosed, for example, in U.S. Pat. No. 2,934,009 issued to Bach et al for Sheet Feeding and Treating. The base incorporates a mechanical drive, not shown, for providing mechanical drive energy for the printing drum of meter 12. The postage meter 12 is an electronic postage meter in the sense that the accounting system within the meter, including the registers, is electronic as opposed to mechanical. Power is supplied to the meter 12 via an AC power cord 118. The power cord 118 is connected to terminal 34 within the conductive shielding provided by the metal meter housing 120. A keyboard 122 and display 124 are provided and are connected to the control module 18 microprocessor and control circuit.

What is claimed is:

1. A memory protection circuit adapted to be energized by a power supply having a predetermined power condition, comprising:
   nonvolatile memory means having a WRITE voltage terminal which when energized by a predetermined voltage enables said nonvolatile memory to have data written into memory locations;
   computing means coupled to said nonvolatile memory means for writing data into said memory locations of said nonvolatile memory means;
   means for generating a potential said predetermined voltage;
   means for detecting said predetermined power condition; and
   means coupled to said voltage generating means, said detecting means and said nonvolatile memory WRITE voltage terminal for applying said voltage to said WRITE voltage terminal during a predetermined power condition, and for removing said voltage to said nonvolatile memory WRITE voltage terminal when said predetermined power condition is not present, said applying and removing means being operable independent of the operation of said computing means.

2. A circuit as defined in claim 1 wherein said nonvolatile memory is an NMOS type memory device.

3. A circuit as defined in claim 2 including a data bus coupled between said NMOS memory and said computing means.

4. A circuit as defined in claim 3 further including printing means adapted to print postage and wherein said computing means is part of an accounting means coupled to said printing means.

5. In an electronic postage meter adapted to be energized by an external source of operating voltage, a system comprising:
   printing means for printing postage;
   accounting means coupled to said printing means for accounting for postage printed by said printing means;
   nonvolatile memory means coupled to said accounting means for storing accounting data when said external source of operating voltage is not operating to energize said postage meter;
   said nonvolatile memory having a WRITE voltage terminal which, when energized by voltage of a first predetermined polarity, enables said nonvolatile memory to have data written into memory locations by said accounting means;
   first means for generating a voltage of said first predetermined polarity;
   second means for generating a second voltage differing from said voltage of said first predetermined polarity;
   means coupled to said first voltage generating means, said second voltage generating means and said WRITE voltage terminal for applying said voltage of said first predetermined polarity to said WRITE voltage terminal when said external source of operating potential is above a predetermined level and for applying said second voltage to said WRITE voltage terminal when said external source of operating voltage is below said predetermined level.

6. A system as defined in claim 5 wherein said means coupled to said first voltage generating means, said second voltage generating means and said WRITE voltage terminal, comprises:
   a first transistor and a second transistor each having a first, a second and a control electrode, said first-second electrode current path of said first transistor coupled in series of between said WRITE voltage terminal and said first means for generating a voltage of said predetermined polarity;
   sensing means adapted to sense when said external source of operating voltage is above or below said predetermined level, said sensing means coupled to the control electrode of said second transistor; and
   coupling means connecting said second electrode of said first transistor to said second means for generating said second voltage.

7. A system as defined in claim 6 wherein said sensing means includes a second transistor coupled between said first means for generating a voltage of said first predetermined polarity and a source of DC operating power energized by said external source of operating voltage, said second transistor controlling the bias applied to said control electrode of said first transistor.

8. A system as defined in claim 5 wherein said nonvolatile memory is an NMOS type memory and said computing means.

9. A system as defined in claim 8 wherein said accounting means includes computing means for writing data into said nonvolatile memory locations.

10. A system as defined in claim 9 including a data bus coupled between said NMOS memory and said computing means.

11. A system as defined in claim 10 wherein said nonvolatile memory means includes a terminal adapted to be energized by a source of operating potential of a polarity opposite to said first predetermined polarity for energizing said nonvolatile memory to operate, and coupling means connected between said terminal adapted to be energized by said source of operating potential and said second means for generating said second voltage, said second voltage being of a polarity opposite to said first predetermined polarity.

12. In an electronic postage meter adapted to be energized by an external source of operating voltage, a system comprising:
   printing means for printing postage;
   accounting means coupled to said printing means for accounting for postage printed by said printing means;
   nonvolatile memory means coupled to said accounting means for storing accounting data when said external source of operating voltage is not operating to energize said postage meter;
   said nonvolatile memory having a WRITE voltage terminal which, when energized by voltage of a first predetermined polarity, enables said nonvolatile memory to have data written into memory locations by said accounting means;
   a first transistor having a first, a second and a control electrode;
   means coupling said control electrode of said first transistor to said accounting means such that said accounting means controls the conductivity of said first-second electrode current path of said first transistor;

means coupling said first transistor second electrode to said WRITE voltage terminal of said nonvolatile memory;

first means for generating a voltage of said first predetermined polarity;

second means for generating a second voltage differing from said voltage of said first predetermined polarity;

means coupled to said first voltage generating means, said second voltage generating means and said first electrode of said first transistor for applying said voltage of said first predetermined polarity to said first electrode of said first transistor when said external source of operating potential is above a predetermined level and for applying said second voltage to said first electrode of said first transistor when said external source of operating voltage is below said predetermined level.

13. A system as defined in claim 12 wherein said means coupled to said first voltage generating means, said second voltage generating means and said first electrode of said first transistor, comprises:

a second transistor having a first, a second and a control electrode, said first-second electrode current path of said second transistor coupled in series of between said first electrode of said first transistor and said first means for generating a voltage of said predetermined polarity;

sensing means adapted to sense when said external source of operating voltage is above or below said predetermined level, said sensing means coupled to the control electrode of said second transistor; and coupling means connecting said second electrode of said second transistor to said second means for generating said second voltage.

14. A system as defined in claim 13 wherein said sensing means includes a third transistor coupled between said first means for generating a voltage of said first predetermined polarity and a source of DC operating power energized by said external source of operating voltage, said third transistor controlling the bias applied to said control electrode of said second transistor.

15. A system as defined in claim 14 wherein said third transistor includes a first and a second electrode connected in a series with a zener diode, and said first-second electrode current path of said third transistor and said zener diode connected between said first means for generating a voltage of said first predetermined polarity and said DC power supply.

16. A system as defined in claim 15 wherein said first and said second transistors are NPN type transistors with said first electrodes being emitter electrodes, said second electrodes being collector electrodes, and said control electrode being a base electrode, and said third transistor is a PNP type transistor.

17. A system as defined in claim 12 wherein said nonvolatile memory is an NMOS type memory device.

18. A system as defined in claim 17 wherein said accounting means includes computing means for writing data into said nonvolatile memory locations.

19. A system as defined in claim 18 including a data bus coupled between said NMOS memory and said computing means.

20. A system as defined in claim 19 wherein said nonvolatile memory means includes a terminal adapted to be energized by a source of operating potential of a polarity opposite to said first predetermined polarity for energizing said nonvolatile memory to operate, and coupling means connected between said terminal adapted to be energized by said source of operating potential and said second means for generating said second voltage, said second voltage being of a polarity opposite to said first predetermined polarity.

21. In an electronic postage meter adapted to be energized by an external source of operating voltage, a system comprising:

printing means for printing postage;

accounting means coupled to said printing means for accounting for postage printed by said printing means;

nonvolatile memory means coupled to said accounting means for storing accounting data when said external source of operating voltage is not operating to energize said postage meter;

said nonvolatile memory having a WRITE voltage terminal which, when energized by voltage of a first predetermined polarity, enables said nonvolatile memory to have data written into memory locations by said accounting means;

a first transistor having a first, a second and a control electrode;

means coupling said control electrode of said first transistor to said accounting means such that said accounting means controls the conductivity of said first-second electrode current path of said first transistor;

means coupling said first transistor second electrode to said WRITE voltage terminal of said nonvolatile memory;

first means for generating a voltage of said first predetermined polarity;

second means for generating a second voltage differing from said voltage of said first predetermined polarity;

means coupled to said first voltage generating means, said second voltage generating means and said first electrode of said first transistor for applying said voltage of said first predetermined polarity to said first electrode of said first transistor when said external source of operating potential is above a predetermined level and for applying said second voltage to said first electrode of said first transistor when said external source of operating voltage is below said predetermined level; and impedance means coupled between said second voltage generating means and said WRITE voltage terminal of said nonvolatile memory.

22. A system as defined in claim 21 wherein said means coupled to said first voltage generating means, said second voltage generating means and said first electrode of said first transistor, comprises:

a second transistor having a first, a second and a control electrode, said first-second electrode current path of said second transistor coupled in series of between said first electrode of said first transistor and said first means for generating a voltage of said predetermined polarity;

sensing means adapted to sense when said external source of operating voltage is above or below said predetermined level, said sensing means coupled to the control electrode of said second transistor; and coupling means connecting said second electrode of said second transistor to said second means for generating said second voltage.

23. A system as defined in claim 21 wherein said nonvolatile memory means includes a terminal adapted to be energized by a source of operating potential of a polarity opposite to said first predetermined polarity or energizing said nonvolatile memory to operate, and coupling means connected between said terminal adapted to be energized by said source of operating potential and said second means for generating said second voltage, said second voltage being of a polarity opposite to said first predetermined polarity.

24. A system as defined in claim 23 wherein said impedance means is a resistor.

25. In an electronic postage meter adapted to be energized by an external source of operating voltage, a system comprising:

printing means for printing postage;

accounting means coupled to said printing means for accounting for postage printed by said printing means;

nonvolatile memory means coupled to said accounting means for storing accounting data when said external source of operating voltage is not operating to energize said postage meter;

said nonvolatile memory having a WRITE voltage terminal which, when energized by voltage of a first predetermined polarity, enables said nonvolatile memory to have data written into memory locations by said accounting means;

first means for generating a voltage of said first predetermined polarity;

a first and a second three terminal switching device each having a first, a second and a control terminal, said first-second terminal current path of said first and said second device connected in series between said WRITE voltage terminal and said voltage generating means;

means coupling said control electrode of said first device to said acounting means such that said accounting means controls the conductivity of said first-second electrode current path of said first transistor;

means for sensing the voltage level of said source of operating potential; and means coupling the control terminal of said second device to said sensing means such that said sensing means control the conductivity of said first-second terminal of said second device such that said second device is operated independent of the operation of the accounting means.

26. A system as defined in claim 25 wherein said first and said second three terminal devices are transistors.

27. A memory protection circuit adapted to be energized by a power supply having a predetermined power condition, comprising:

nonvolatile memory means having a WRITE voltage terminal which when energized by a voltage of a first predetermined polarity enables said nonvolatile memory to have data written into memory locations;

computing means coupled to said nonvolatile memory means for writing data into said memory locations of said nonvolatile memory means;

first means for generating a voltage of said first predetermined polarity;

second means for generating a voltage of a polarity opposite to said first predetermined polarity; and means coupled to said first voltage generating means, said second voltage generating means and said nonvolatile memory WRITE voltage terminal for applying said first voltage of said first predetermined polarity to said WRITE voltage terminal during a predetermined power condition, and for applying said voltage of said opposite polarity to said nonvolatile memory WRITE voltage terminal when said predetermined power condition is not present.

* * * * *